United States Patent
Annapragada et al.

(10) Patent No.: US 6,303,192 B1
(45) Date of Patent: Oct. 16, 2001

(54) PROCESS TO IMPROVE ADHESION OF PECVD CAP LAYERS IN INTEGRATED CIRCUITS

(75) Inventors: Rao V. Annapragada, San Jose; Tekle M. Tafari, Milpitas; Subhas Bothra, San Jose, all of CA (US)

(73) Assignee: Philips Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 09/121,180

(22) Filed: Jul. 22, 1998

(51) Int. Cl.[7] .................................................. C23C 14/16
(52) U.S. Cl. ........................... 427/527; 427/99; 427/103; 427/255.27; 427/255.7; 427/407.1; 427/529; 427/530; 427/531; 427/535; 427/539; 427/579; 427/585; 427/590

(58) Field of Search .............................. 427/579, 407.1, 427/99, 103, 527, 529, 530, 531, 535, 539, 585, 590, 255.27, 255.7

(56) References Cited

U.S. PATENT DOCUMENTS 4,801,560 * 1/1989 Wood et al. .

\* cited by examiner

Primary Examiner—Bernard Pianalto
(74) Attorney, Agent, or Firm—Oppenheimer Wolff & Donnelly LLP

(57) ABSTRACT

A method for making a multi-layered integrated circuit structure, includes depositing a methyl compound spin on glass layer over a substrate. The spin on glass layer is treated by plasma-deposition to form a $SiO_2$ skin on the methyl compound spin on glass layer and then treated again by plasma-deposition to form a cap layer which adheres to the $SiO_2$ skin.

20 Claims, 5 Drawing Sheets

PROCESS TO IMPROVE ADHESION OF PECVD CAP LAYERS IN INTEGRATED CIRCUITS

CROSS REFERENCE TO RELATED APPLICATIONS

This application is related to the following U.S. patent application Ser. No. 09/120,895, U.S. Pat. No. 6,001,747, filed on the same day herewith, incorporated herein by reference.

BACKGROUND OF THE INVENTION

1. Field of the Invention

The present invention relates generally to semiconductor manufacturing processes, and more particularly to techniques for improving the adhesion of plasma enhanced chemical vapor deposition (PECVD) cap layer to an underlayer that includes methyl compounds.

2. Description of the Related Art

As semiconductor manufacturing technology produces devices that are faster and more efficient, both the density of conductive lines and the frequency of charges flowing on the conductive lines tend to increase. Because semiconductors rely on insulating (i.e. dielectric) layers to reduce capacitive coupling between the conductive lines, it has become increasingly important to have insulation that is able to accommodate both the higher operating frequencies and the shrinking distances between the lines.

FIG. 1A is a cross-sectional view illustrating the respective layers of a typical semiconductor structure 10. The semiconductor structure 10 is made up of several layers including a PECVD cap layer 12, a spin on glass (SOG) layer 14 that is preferably made from a silicate base, and a semiconductor substrate 16. The semiconductor substrate 16 typically supports a first metal layer 18 formed into a number of conductive traces 18a, 18b, 18c and 18d.

A second metal layer 22 including traces 22a and 22b may be provided over the PECVD cap layer 12. A number of conductive vias, such as conductive via 20, are provided through the SOG layer 14 and the PECVD cap layer 12, connecting the traces of metal layer 18 to traces of metal layer 22. For ease of illustration, only one conductive via 20 and six metal traces 18a–d and 22a–b are shown, but as is well known in the art, many more conductive vias and metal traces are used to provide appropriate connections in a semiconductor or integrated circuit device.

A first plurality of capacitive couplings 26 exist between the first metal layer 18 and the second metal layer 22. A second plurality of capacitive couplings 28 exist between the metal traces 18a–d. The purpose of the SOG layer 14 is to insulate the metal traces and to reduce capacitive couplings 26 and 28 by providing a dielectric between the traces.

With higher line density and higher operating frequencies, the coupling capacitances 26 and 28 are increasing to the point that SOG layer 14 is a less than adequate insulator. Raising the operating frequency requires a reduction in both the first coupling capacitance 26 and the second coupling capacitance 28. However, increasing the densities of the metal traces 18a–d decreases the distance $d_1$ between each of the metal traces 18a–d which increases the second capacitive coupling 28.

Another important dimension in FIG. 1A is the thickness $t_1$ of the SOG layer 14. If the insulating material can be made thicker, the first coupling capacitance 26 can be reduced. Unfortunately, the SOG layer 14 may have only a maximum thickness $t_1$ of about 3,000 Angstroms. If the SOG layer thickness $t_1$ exceeds 3,000 Angstroms, the SOG layer 14 will begin to crack and form rifts 30. Therefore, semiconductors need an alternative material that is both a better insulator (having a lower dielectric constant) and which resists cracking.

One way for improving silicate SOG material is to add methyl (—$CH_3$) groups as side groups to the silicate backbone. Such a material is referred to as methyl silsesquioxane (MSQ) based SOG. Adding methyl side groups lowers the dielectric constant of the SOG insulating layer and allows a thickness greater than 3,000 Angstroms of the SOG layer without cracking. Unfortunately, adding methyl side groups to SOG also causes the PECVD cap layer, which is added to protect the semiconductor structure, to peel away during a subsequent chemical mechanical polishing (CMP) process used to planarize the cap layer. This is because the cap layer doesn't adhere well to the MSQ-SOG layer.

FIG. 1B is a cross-sectional view illustrating the respective layers of a semiconductor structure 32 incorporating an MSQ-SOG layer 34. When a methyl compound (e.g. MSQ) is added to the SOG, it lowers the relative dielectric constant of the insulating layer from about 4.0 to about 2.8. In addition, an MSQ-SOG layer 34 can have a thickness $t_2$ of up to about 5,000 Angstroms without cracking. However, the PECVD cap layer 12 does not adhere well to the MSQ-SOG layer 34 and tends to peel and flake away from the MSQ-SOG layer 34 during subsequent CMP processes, as noted previously.

One method of improving adhesion between the MSQ-SOG layer 34 and the PECVD cap layer 12 is to use a reactive ion etching (RIE) tool to bombard the MSQ-SOG layer 34 with an oxygen ($O_2$) plasma. However, a problem with using the RIE-$O_2$ technique is that the semiconductor wafer must be moved to an RIE tool, be processed in the RIE tool, and then returned to the PECVD tool. This adds a great deal of time and cost to the process.

FIG. 1C shows a flow chart of a prior art solution to reduce PECVD cap layer peeling. In an operation 36, a metal layer is deposited to begin the forming of an integrated circuit. In an operation 38, a MSQ-SOG layer is deposited on top of the metal layer. In operation 40, the methyl layer SOG is surface treated by using an reactive ion etching tool with oxygen plasma (RIE-$O_2$) to convert a thin surface portion ("skin") of the MSQ-SOG layer into $SiO_2$.

Moving the unfinished wafer to a RIE-$O_2$ tool, and then transferring the wafer back to the original processing chamber to deposit the cap layer necessarily adds substantial cost and time to the process. In addition, wafers are often processed in batches, causing even more delay at the RIE tool. Finally, in operation 42, the PECVD cap oxide is deposited, adhering to the $SiO_2$ skin.

In view of the foregoing, it is desirable to have a method that provides for a low dielectric constant, low-cracking insulating material that adheres well to the PECVD cap layer without adding significant time or cost to the process.

SUMMARY OF THE INVENTION

Broadly speaking, the present invention fills these needs by providing an efficient and economical method for improving adhesion of MSQ-SOG material and PECVD cap oxide. It should be appreciated that the present invention can be implemented in numerous ways, including as a process, an apparatus, a system, a device or a method. Several inventive embodiments of the present invention are described below.

In one embodiment, a method for making a multi-layered integrated circuit structure is disclosed. This method includes: (a) depositing a methyl compound spin on glass layer over a substrate; and (b) plasma-deposition treating the spin on glass layer under a first set of conditions to form an $SiO_2$ skin on the SOG layer and then under a second set of conditions to form a cap layer which adheres to the $SiO_2$ skin. Preferably, the plasma-depositions are performed in a same processing chamber.

An advantage of the present invention is that it improves adhesion between MSQ-SOG and PECVD cap oxide. MSQ-SOG is a vast improvement over standard SOG because it has a lower dielectric constant. Furthermore, MSQ-SOG material can also be made much thicker than normal SOG because it resists cracking. Both of these factors reduce inter metal capacitance in the integrated circuit.

An additional advantage of the present invention is that it improves the adhesion of the MSQ-SOG and the PECVD cap layer without the additional procedures, time and expense associated with using a separate $RIE-O_2$ tool. Instead, the oxygen ion bombardment can be accomplished using the same PECVD tool that is necessary to deposit the cap layer in a matter of seconds. Therefore, the process of the present invention saves time and money, as well as reduces the chance for contamination of the semiconductor wafer during the transfer of the wafer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for a method to improve adhesion of a PECVD cap layer to methyl compounds is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
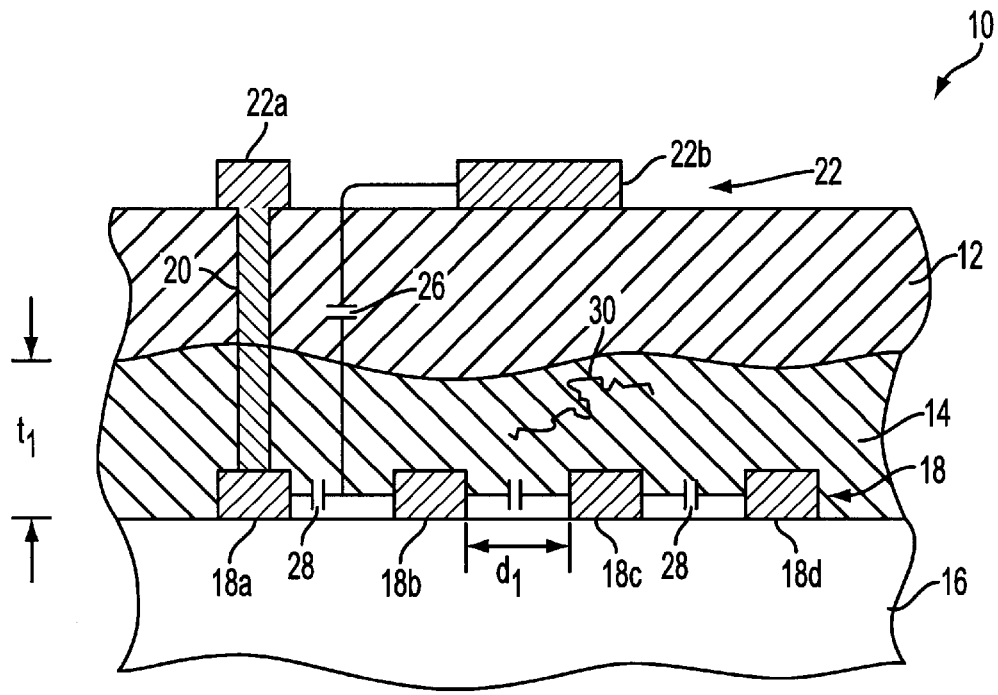
FIG. 1A is a cross-sectional view illustrating several layers of a prior art integrated circuit.
Figure 1B:
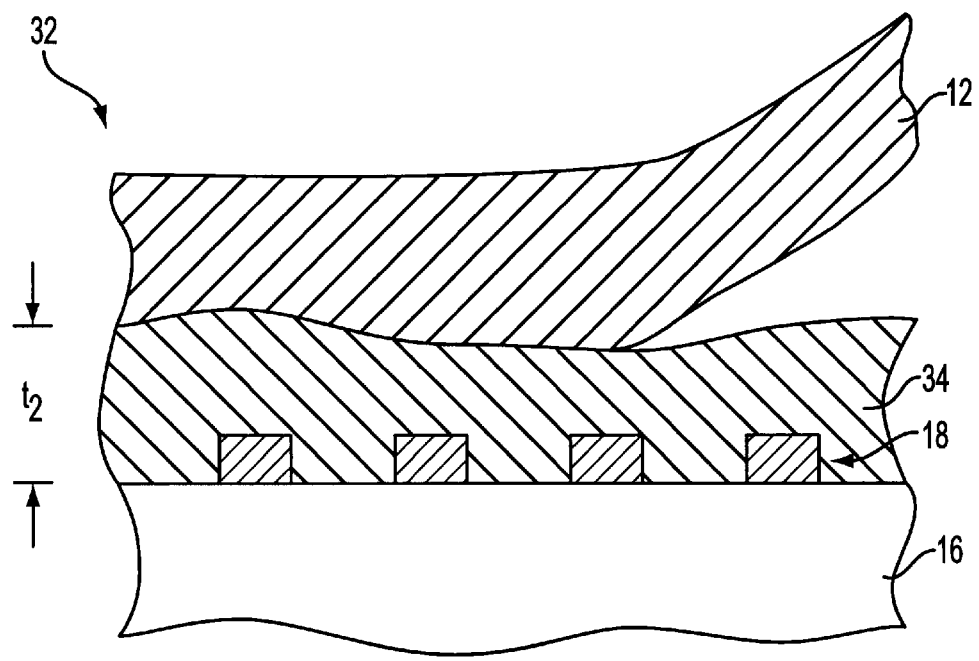
FIG. 1B is a cross-sectional view illustrating several layers of a prior art integrated circuit incorporating a MSQ-SOG layer.
Figure 1C:
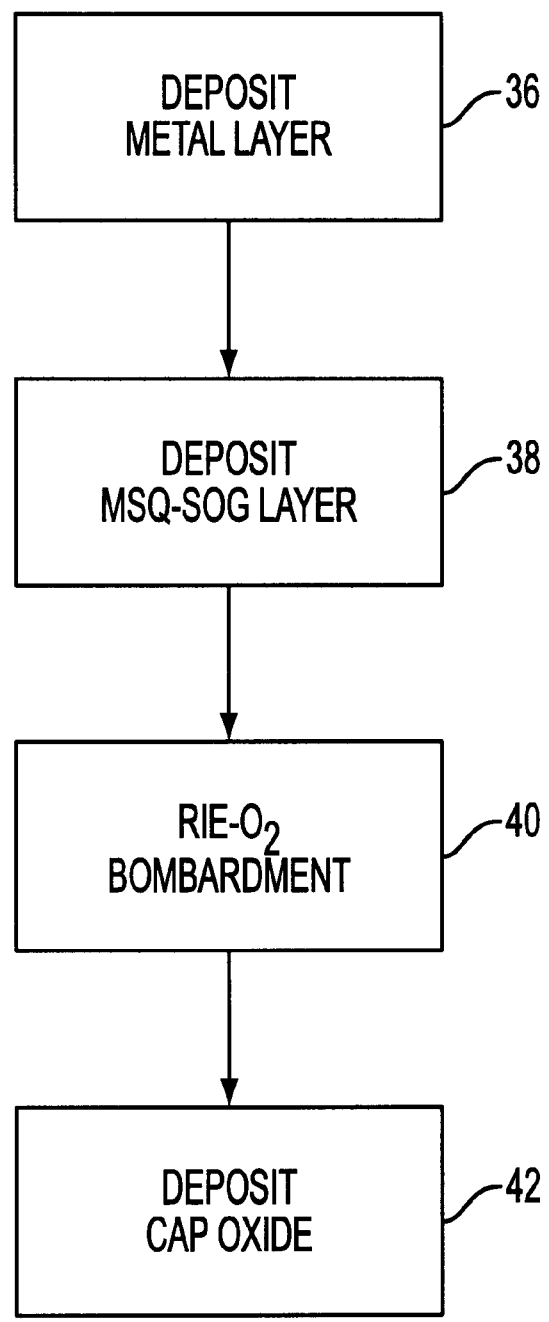
FIG. 1C shows a flow chart of a prior art solution to preventing PECVD cap layer peeling.
Figure 2:
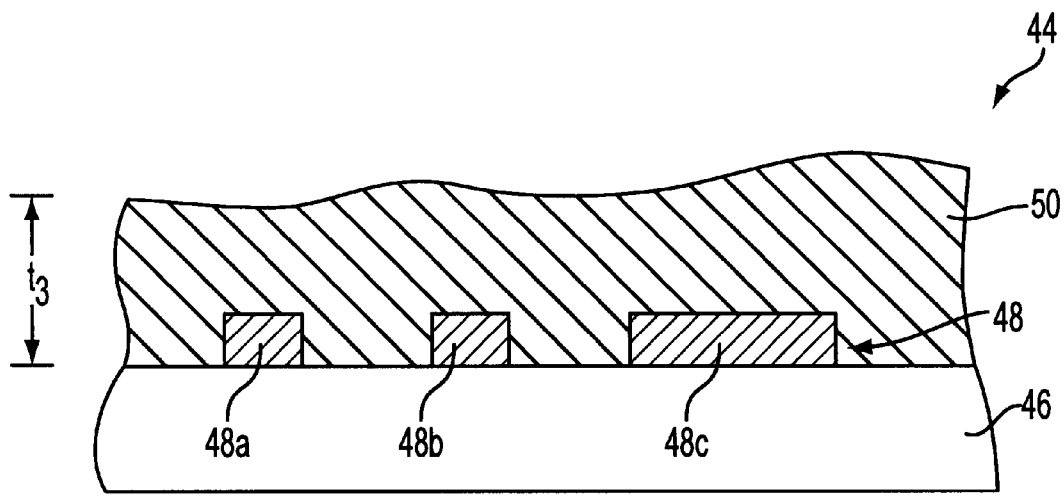
FIG. 2 is a cross-sectional view illustrating several layers of an integrated circuit being formed by a process in accordance with the present invention.

FIG. 2 is a cross-sectional view illustrating several layers of an integrated circuit 44 being formed by a process in accordance with the present invention. In the beginning of the process, a metal layer 48 is deposited on top of a semiconductor substrate 46, and is then patterned. A MSQ-SOG layer 50 is deposited on top of the metal layer 48 to act as an insulator. The MSQ-SOG thickness $t_3$ is generally at least about 3,000 Angstroms. Preferably, the methyl compound is methyl silsesquioxane and thickness $t_3$ is about 3,000 to about 5,000 Angstroms. MSQ-SOG is sold commercially by various vendors. An MSQ-SOG named HSG is sold by Hitachi Chemical Company located in San Jose, Calif. The percentage of methyl side groups present in MSQ-SOG is preferably between about 5% and about 40%.

Figure 3A:
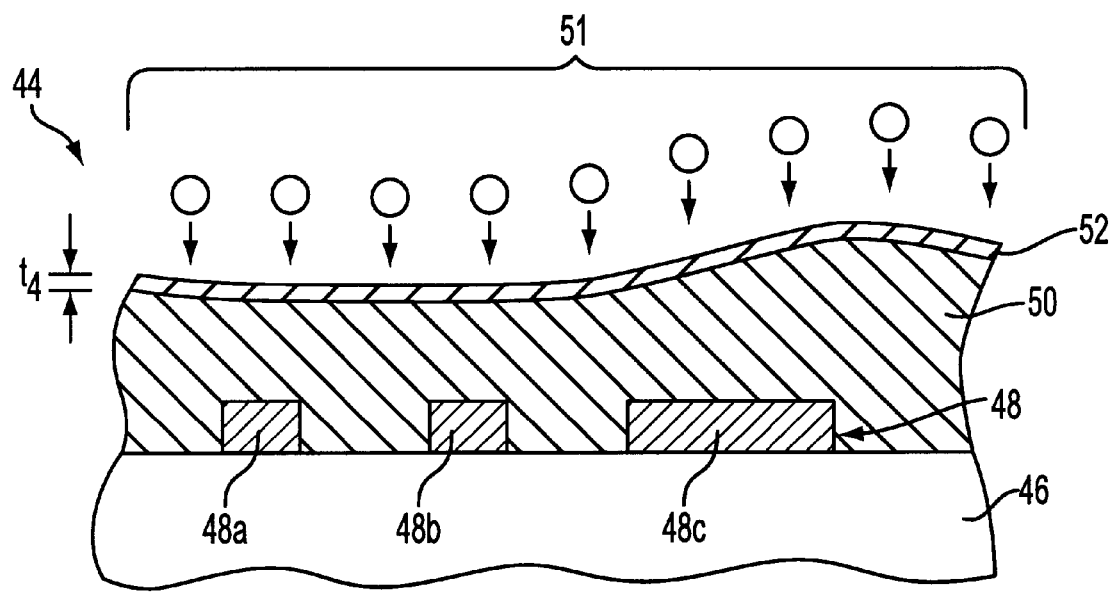
FIG. 3A is a cross-sectional view of the integrated circuit during oxygen ion bombardment.

FIG. 3A is a cross-sectional view of the integrated circuit 44 during oxygen ion bombardment. The integrated circuit 44 remains in the processing chamber of the PECVD system. That is, it doesn't have to be moved from the PECVD system to a RIE tool and back, as in the prior art. The MSQ-SOG 50 is bombarded with high energy oxygen ions 51 that convert the surface of the MSQ-SOG 50 into a $SiO_2$ skin 52.

The MSQ-SOG 50 should have a dielectric constant of between about 2.0 and about 3.5, and preferably a dielectric constant of 2.8. The $SiO_2$ skin thickness $t_4$ should be between about 50 to about 1,000 Angstroms, preferably about 200 to about 600 Angstroms, and optimally about 400 Angstroms. Because the thickness of the $SiO_2$ skin 52 is dependent upon the depth of penetration of the oxygen ions, an optimal level of thickness can be achieved by operating the processing chamber at low frequencies, as will be discussed in greater detail subsequently.

The PECVD system should be operated between about 100 to about 1,000 kHz for between about 5 seconds, and about 60 seconds, and preferably about 15 seconds. This is a far lower frequency than that used for the PECVD process, which is typically 13.56 MHz. More preferably, the PECVD system is operated at about 100 to about 500 kHz to prevent the oxygen ions from penetrating too deeply into the MSQ-SOG 50. Optimally, the frequency should be set to about 200 or to about 400 kHz because they are easily achieved frequency settings on the PECVD processing chamber.

Figure 3B:
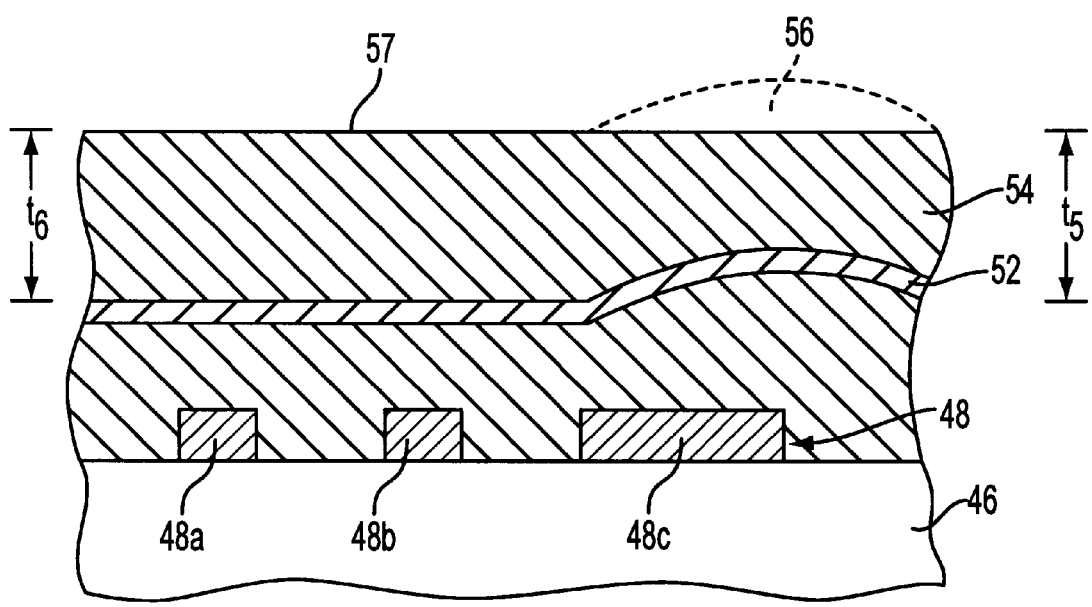
FIG. 3B is a cross-sectional view of the integrated circuit after chemical mechanical polishing (CMP).

FIG. 3B is a cross-sectional view of the integrated circuit 44 after the deposition of the cap layer 54 and after CMP. After oxygen ion bombardment, the PECVD cap layer 54 is deposited. PECVD cap layer thickness $t_5$ typically ranges from about 5,000 to about 12,000 Angstroms. After the PECVD cap layer 54 has been deposited, the CMP process planarizes and polishes the PECVD cap layer 54 so that excess PECVD cap layer 56 is removed, forming planar surface 57.

The PECVD cap layer 54 adheres to the $SiO_2$ skin 52 and resists peeling because the methyl groups present in the MSQ-SOG layer 50 are shielded away from the PECVD cap layer 54 by the $SiO_2$ skin 52. After the CMP process, the PECVD cap layer thickness $t_6$ is typically about 2,000 to about 10,000 Angstroms, preferably in the range of about 4,000 to about 5,000 Angstroms.

Figure 4:
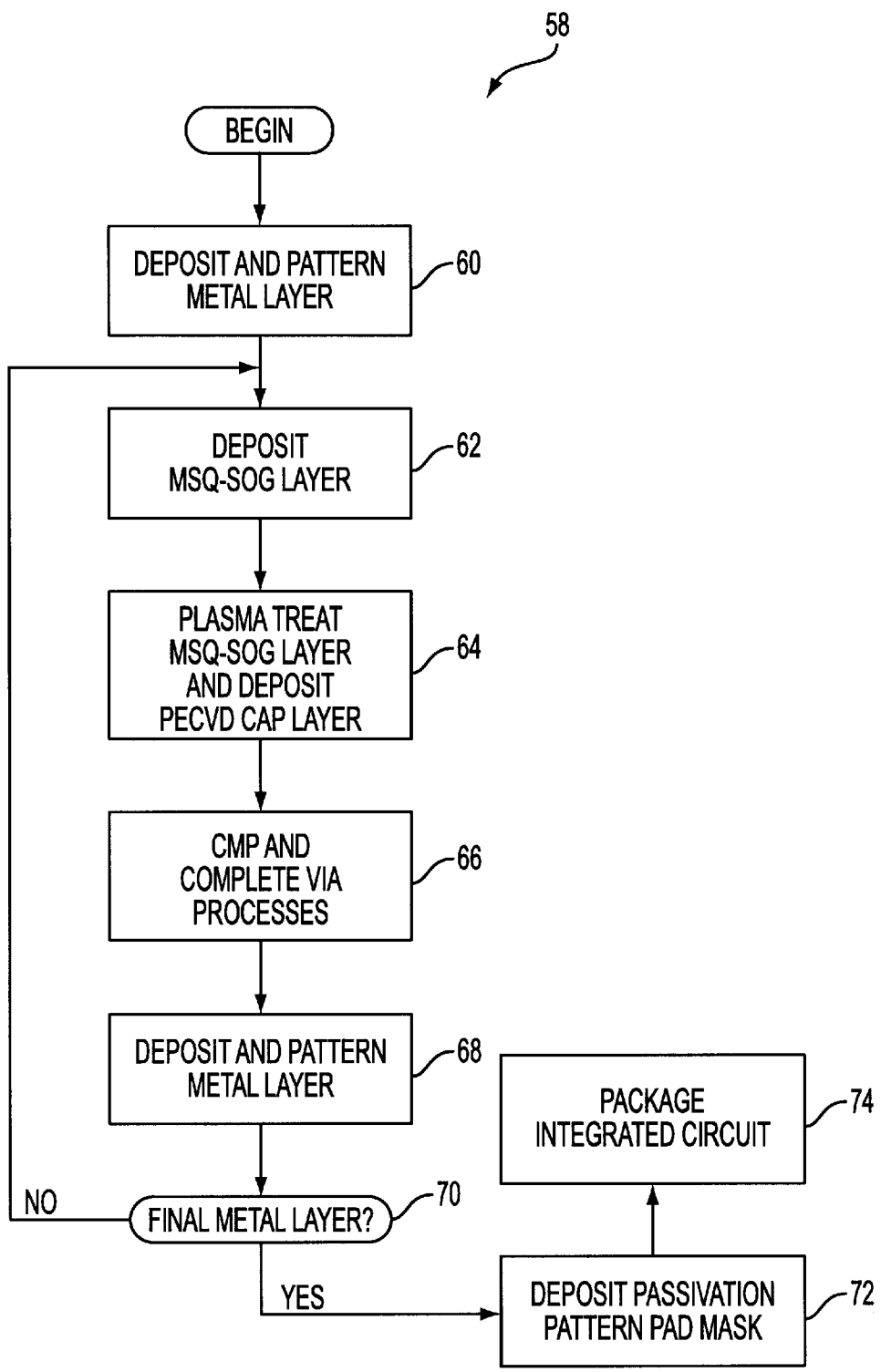
FIG. 4 is a flow chart of a method for improving adhesion of PECVD cap layer to MSQ-SOG in accordance with the present invention.

The above described invention may be further understood with reference to a flow chart presented in FIG. 4. The flow chart encompasses a process 58 of making a semiconductor structure that improves adhesion of a PECVD cap layer to a MSQ-SOG layer. The method 58 begins at an operation 60 where a metal layer is deposited onto the semiconductor substrate. The metal layer typically comprises of conductive metal traces. In an operation 62, the MSQ-SOG layer is deposited onto the metal layer. Preferably the methyl compound is methyl silsesquioxane (MSQ), which has a dielectric constant of about 2.8. MSQ-SOG is used because it is a better insulator than SOG and it also resists cracking.

In an operation 64, the MSQ-SOG layer is treated with oxygen plasma and a PECVD cap layer is deposited. Bombarding the MSQ-SOG layer with oxygen ions at low frequency converts the surface of the MSQ-SOG layer into a $SiO_2$ skin. Thus, the MSQ-SOG layer is allowed to retain the methyl compounds that improve its insulating and crack resisting characteristics because the $SiO_2$ skin provides good adhesion for the PECVD cap layer.

An operation 66 performs CMP on the PECVD cap layer, and completes the via processes. Then another metal layer is deposited and patterned in operation 68. An operation 70 determines whether the process has deposited the final metal layer onto the semiconductor structure. If not, the process repeats from operation 60. If the final metal layer has been deposited, an operation 72 deposits a passivation pattern pad mask, and a final operation 72 packages the integrated circuit.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a multi-layered integrated circuit structure comprising:

depositing a methyl silsesquioxane spin on glass layer over a substrate; and plasma-deposition treating said methyl silsesquioxane spin on glass layer under a first set of conditions comprising an oxygen plasma within a processing chamber to form a $SiO_2$ skin on said methyl silsesquioxane spin on glass layer and then under a second set of conditions forming within said same processing chamber a cap layer which adheres to said $SiO_2$ skin.

2. A method for making a multi-layered integrated circuit structure as recited in claim 1 wherein said methyl silsesquioxane spin on glass layer is comprised of between about 5% and about 40% of methyl side groups.

3. A method for making a multi-layered integrated circuit structure as recited in claim 1 wherein said methyl silsesquioxane spin on glass layer is formed over a metal layer.

4. A method for making a multi-layered integrated circuit structure as recited in claim 1 wherein said processing chamber is a plasma enhanced chemical vapor deposition machine, and wherein said first set of conditions includes oxygen ion bombardment from an oxygen plasma excited at between about 100 and about 1,000 kHz.

5. A method for making a multi-layered integrated circuit structure as recited in claim 4 wherein said plasma is excited at between about 100 and about 500 kHz.

6. A method for making a multi-layered integrated circuit structure as recited in claim 5 wherein said plasma is excited at about 200 kHz.

7. A method for making a multi-layered integrated circuit structure as recited in claim 5 wherein said plasma is excited at about 400 kHz.

8. A method for making a multi-layered integrated circuit structure as recited in claim 4 wherein said plasma further comprises nitrogen.

9. A method for making a multi-layered integrated circuit structure as recited in claim 4 wherein said first set of conditions includes oxygen ion bombardment for about 5 to about 60 seconds.

10. A method for making a multi-layered integrated circuit structure as recited in claim 9 wherein said first set of conditions includes oxygen ion bombardment for about 15 seconds.

11. A method for making a multi-layered integrated circuit structure as recited in claim 1 wherein said methyl silsesquioxane spin on glass layer is preferably at least about 3,000 Angstroms in thickness.

12. A method for making a multi-layered integrated circuit structure as recited in claim 11 wherein said methyl silsesquioxane spin on glass layer is preferably in the range of about 3,000 and about 5,000 Angstroms in thickness.

13. A method for making a multi-layered integrated circuit structure as recited in claim 1 wherein said $SiO_2$ skin is preferably in the range of about 50 and about 1,000 Angstroms in thickness.

14. A method for making a multi-layered integrated circuit structure as recited in claim 13 wherein said $SiO_2$ skin is preferably in the range of about 200 and about 600 Angstroms in thickness.

15. A method for making a multi-layered integrated circuit structure as recited in claim 14 wherein said $SiO_2$ skin is preferably about 400 Angstroms in thickness.

16. A method for making a multi-layered integrated circuit structure as recited in claim 1 wherein said cap layer is preferably in the range of about 2,000 and about 10,000 Angstroms in thickness.

17. A method for making a multi-layered integrated circuit structure as recited in claim 16 wherein said cap layer is preferably in the range of about 4,000 and about 5,000 Angstroms in thickness.

18. A method for making a multi-layered integrated circuit structure as recited in claim 1 wherein said methyl silsesquioxane spin on glass has a dielectric constant in the range of about 2.0 and about 3.5.

19. A method for making a multi-layered integrated circuit structure as recited in claim 18 wherein said methyl silsesquioxane spin on glass has a dielectric constant of about 2.8.

20. A method for making a multi-layered integrated circuit structure as recited in claim 1 wherein said cap layer is planarized by chemical mechanical polishing.

* * * * *